(12) United States Patent
Ayazi et al.

(10) Patent No.: US 6,909,221 B2
(45) Date of Patent: Jun. 21, 2005

(54) PIEZOELECTRIC ON SEMICONDUCTOR-ON-INSULATOR MICROELECTROMECHANICAL RESONATORS

(75) Inventors: Farrokh Ayazi, Atlanta, GA (US); Gianluca Piazza, Lodi (IT); Reza Abdolvand, Atlanta, GA (US); Gavin Kar-Fai Ho, Atlanta, GA (US); Shweta Humad, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/631,948

(22) Filed: Jul. 31, 2003

(65) Prior Publication Data

US 2004/0021403 A1 Feb. 5, 2004

Related U.S. Application Data

(60) Provisional application No. 60/400,030, filed on Aug. 1, 2002.

(51) Int. Cl.$^7$ ............................................. H01L 41/08
(52) U.S. Cl. ........................ 310/321; 310/312; 310/324
(58) Field of Search ................................ 310/311, 312, 310/321, 324, 328, 320, 366, 322

(56) References Cited

U.S. PATENT DOCUMENTS

| | | | | |
|---|---|---|---|---|
| 3,513,356 A | * | 5/1970 | Newell | 257/418 |
| 3,634,787 A | * | 1/1972 | Newell | 333/186 |
| 3,766,616 A | * | 10/1973 | Staudte | 29/25.35 |
| 5,162,691 A | | 11/1992 | Mariani et al. | 310/321 |
| 5,426,070 A | | 6/1995 | Shaw et al. | 437/203 |
| 5,491,604 A | | 2/1996 | Nguyen et al. | 361/278 |
| 5,587,620 A | | 12/1996 | Ruby et al. | 310/346 |
| 5,589,082 A | | 12/1996 | Lin et al. | 216/2 |
| 5,663,505 A | * | 9/1997 | Nakamura | 73/702 |
| 5,719,073 A | | 2/1998 | Shaw et al. | 437/228 |
| 5,846,849 A | | 12/1998 | Shaw et al. | 437/52 |
| 5,847,454 A | | 12/1998 | Shaw et al. | 257/734 |
| 5,873,153 A | | 2/1999 | Ruby et al. | 29/25.35 |
| 5,884,378 A | | 3/1999 | Dydyk | 29/25.35 |
| 5,894,647 A | | 4/1999 | Lakin | 29/25.35 |
| 5,914,801 A | | 6/1999 | Dhuler et al. | 359/230 |

(Continued)

OTHER PUBLICATIONS

Ayazi, et al.; Capacitive Resonators and Methods of Fabrication; U.S. Appl. No. 10/632,176; filed Jul. 31, 2003.

Bourgeois, et al.; Design of Resonators for the Determination of the Temperature Coefficients of Elastic Constants of Monocrystalline Silicon; 1997 IEEE International Frequency Control Symposium; Orlando, FL.; pp. 791–799.

Mihailovich, et al.; Dissipation Measurements of Vacuum–Operated Single–Crystal Silicon Microresonators, Sensors and Actuators A 50 (1995); pp. 199–207.

(Continued)

Primary Examiner—Mark Budd
(74) Attorney, Agent, or Firm—Thomas, Kayden, Horstemeyer & Risley, LLP

(57) ABSTRACT

A piezoelectric resonator is disclosed. In one embodiment the piezoelectric resonator includes a resonating member having a bi-directionally adjustable resonance frequency, the resonating member including a semiconductor material of a semiconductor-on-insulator wafer, the semiconductor-on-insulator wafer including an oxide layer adjacent to the semiconductor material and a handle layer adjacent to the oxide layer, the oxide layer disposed between the handle layer and the semiconductor material, and electrode, and a piezoelectric material disposed between the semiconductor material and the electrode, and a capacitor created by the semiconductor material and the handle layer separated by an air gap formed out of the oxide layer, wherein the capacitor is configured to receive a direct current voltage that adjusts the resonance frequency of the resonating member.

23 Claims, 10 Drawing Sheets

U.S. PATENT DOCUMENTS

| | | | |
|---|---|---|---|
| 5,976,994 A | 11/1999 | Nguyen et al. | 438/795 |
| 5,998,906 A | 12/1999 | Jerman et al. | 310/309 |
| 6,000,280 A | 12/1999 | Miller et al. | 73/105 |
| 6,051,866 A | 4/2000 | Shaw et al. | 257/417 |
| 6,060,818 A | 5/2000 | Ruby et al. | 310/363 |
| 6,067,858 A | 5/2000 | Clark et al. | 73/504.16 |
| 6,087,747 A | 7/2000 | Dhuler et al. | 310/90 |
| 6,121,552 A | 9/2000 | Brosnihan et al. | 174/253 |
| 6,134,042 A | 10/2000 | Dhuler et al. | 359/224 |
| 6,191,476 B1 * | 2/2001 | Takahashi et al. | 257/706 |
| 6,215,375 B1 | 4/2001 | Larson, III et al. | 333/187 |
| 6,236,281 B1 | 5/2001 | Nguyen et al. | 331/154 |
| 6,238,946 B1 | 5/2001 | Ziegler | 438/50 |
| 6,239,536 B1 | 5/2001 | Lakin | 310/364 |
| 6,256,134 B1 | 7/2001 | Dhuler et al. | 359/212 |
| 6,275,122 B1 | 8/2001 | Speidell et al. | 333/186 |
| 6,275,320 B1 | 8/2001 | Dhuler et al. | 359/237 |
| 6,291,931 B1 | 9/2001 | Lakin | 310/364 |
| 6,296,779 B1 | 10/2001 | Clark et al. | 216/66 |
| 6,348,846 B1 | 2/2002 | von Gutfeld et al. | 333/201 |
| 6,373,682 B1 | 4/2002 | Goodwin-Johansson | 361/278 |
| 6,377,438 B1 | 4/2002 | Deane et al. | 361/278 |
| 6,391,674 B2 | 5/2002 | Ziegler | 438/52 |
| 6,428,713 B1 | 8/2002 | Christenson et al. | 216/2 |
| 6,429,755 B2 | 8/2002 | Speidell et al. | 333/197 |
| 6,433,401 B1 | 8/2002 | Clark et al. | 257/524 |
| 6,480,645 B1 | 11/2002 | Peale et al. | 385/18 |
| 6,485,273 B1 | 11/2002 | Goodwin-Johansson | 417/410.2 |
| 6,495,892 B2 | 12/2002 | Goodman et al. | 257/414 |
| 6,497,141 B1 | 12/2002 | Turner et al. | 73/105 |
| 6,555,201 B1 | 4/2003 | Dhuler et al. | 428/137 |

OTHER PUBLICATIONS

Roszhart, et al.; The Effects of Thermoelastic Internal Friction on the Q of Micromachined Silicon Resonators; IEEE Solid State Sensor and Actuator Workshop, Hilton Head, SC 6/4–7/90 (1990) pp 489–494.

Cleland, et al.; Fabrication of High Frequency Nanometer Scale Mechanical Resonators from Bulk Si Crystals; Condensed Matter Physics, CA Inst. of Tech.; Received Jun. 21, 1996, pp. 2653–2655.

No, et al.; The HARPSS Process for Fabrication of Nano–Precision Silicon Electromechanical Resonators; IEEE Conf. of Nanotechology; Oct. 30, 2001; pp. 489–494.

Water, et al.; "Physical and Structural Properties of ZnO Sputtered Films"; Dept. of EE, National Cheng Kung University; Received May 7, 2001; pp. 67–72.

DeVoe; Piezoelectric Thin Film Micromechanical Beam Resonators, Sensors and Actuators, A 88; 2001; pp 263–272.

Bhave, et al.; Poly–Sige: A High–Q Structural Material for Integrated RF Mems; Solid–State Sensor, Actuator and Microsystems Workshop, Hilton Head Island, South Carolina, Jun. 2–6, 2002; pp 34–37.

Hsu, et al.; Q Optimized Lateral Free–Free Beam Micromechanical Resonators; Digest of Technical Papers, The 11th Int. Conf. On Solid–State Sensors & Actuators (Transducers'01), Munich, Germany, Jun. 10–14, 2001, pp. 1110–1113.

Yasumura, et al.; Quality Factors in Micron– and Submicron– Thick Cantilevers; Journal of Microelectromechanical Systems, vol. 9, No. 1, Mar. 2000; pp. 117–125.

Peterson, et al.; Resonant Beam Pressure Sensor Fabricated With Silicon Fusion Bonding; 6th Int. Conference on Solid State Sensors and Actuators (Transduces '91), San Francisco, CA; 1991; pp 664–667.

Abdelmoneum, et al.; Stemless Wine–Glass Mode Disk Micromechanical Resonators; IEEE; 2003; pp 698–701.

Piekarski, et al.; Surface Micromachined Piezoelectric Resonant Beam Filters; Sensors and Actuators, A 91; 2001; pp 313–320.

Lifshitz, et al.; Thermoelastic Damping In Micro– and Nanomechanical Systems; Physical Review B; vol. 61, No. 8; Feb. 15, 2000; pp 5600–5609.

Srikar, et al.; Thermoelastic Damping In Fine–Grained Polysilicon Flexural Beam Resonators; Journal of Microelectromechanical Systems, vol. 11, No. 5; Oct., 2002; pp 499–504.

Lakin; Thin Film Resonators and Filters; IEEE Ultrasonics Symposium; 1999; pp 895–906.

Ruby, et al.; Ultra–Miniature High–Q Filters and Duplexers Using FBAR Technology; IEEE International Solid–State Circuits Conference; 2001; pp 120–121 & 438.

Clark, et al.; High–Q VHF Micromechanical Contour–Mode Disk Resonators; IEEE, 2000; pp 493–496.

Wang, et al.; VHF Free–Free Beam High–Q Micromechanical Resonators; Journal of Microelectromechanical Systems, vol. 9, No. 3; Sep. 2000; pp 347–360.

Piazza, et al.; Voltage–Tunable Piezoelectrically–Transduced Single–Crystal Silicon Resonators on SOI Substrate; in Proc. IEEE Internatinal Microelectro Mechanical Systems Conference (MEMs '03), Koyoto, Japan, Jan. 2003.

Pourkamali, et al.; A 600kHz Electrically–Coupled MEMs Bandpass Filter; MEMs '03 , pp. 702–705.

Pourkamali, et al.; SOI–Based HF and VHF Single–Crystal Silicon Resonators With SUB–100 Nanometer Vertical Capacitive Gaps; Transducers '03, Boston, MA; Jun. 2003.

No, et al.; Single–Crystal Silicon HARPSS Capacitive Resonators With Submicron Gap–Spacing; Solid State Sensors, Actuators and Microsystems Workshop; pp. 281–284, Hilton Head, SC; Jun. 2002.

Amini, et al.; Capacitive Accelerometer; IEEE International Solid–State Circuits Conference; 2000; pp 1–3.

Ho, et al.; Through–Support–Coupled Micromechanical Filter Array; School of Electrical and Computer Engineering; Proc. IEEE International Micro Electro Mechanical Systems Conference (MEMS'04), Maastricht, The Netherlands, Jan. 2004, pp769–772.

Pourkamali, et al.; Fully Single Crystal Silicon Resonators With Deep–Submicron Dry–Etched Transducer Gaps; Proc. IEEE International Micro Electro Mechanical Systems Conference (MEMS '04), The Netherlands, Jan. 2004, pp 813–816.

Pourkamali, et al.; Electrostatically Coupled Micromechanical Beam Filters; Proc. IEEE International Micro Electro Mechanical Systems Conference (MEMS '04), The Netherlands, Jan. 2004, pp. 584–587.

Amini, et al.; A High Resolution, Stictionless, CMSO Compatible SOI Accelerometer with a Low Noise, Low Power, 0.25 μm CMOS Interface; IEEE MEMS'04, Jan. 2004, pp. 572–575.

Humad, et al.; High Frequency Micromechanical Piezo–On–Silicon Block Resonators; IEEE; 2003.

Abdolvand, et al.; Thermoelastic Damping in Trench–Refilled Polysilicon Resonators; IEEE; 2003; pp 324–327.

Sundaresan, et al.; A 7–MHZ Process, Temperature and Supply Compensated Cloak Oscillator in 0.25μm CMOS; Proc. of International Symposium on Circuits and Systems (ISCAS) 2003, vol. 1, pp. 693–696, May 2003.

No, et al.; Single–Crystal Silicon HARPSS Capacitive Resonators With Submicron Gap–Spacing; Solid–State Sensor, Actuator and Microsystems Workshop, Hilton Head Island, South Carolina, Jun. 2–6, 2002; pp 281–284.

Balaraman, et al.; Low–Cost Low Actuation Voltage Copper RF MEMS Switches; IEEE; 2002; pp 1225–1228.

Dalmia; Design of Inductors in Organic Substrates For 1–3 GHz Wireless Applications; IEEE; 2002; pp 1405–1408.

Dalmia, et al.; High–Q RF Passives on Organic Substrates Using a Low–Cost Low–Temperature Laminate Process; Proc. 2002 Symposium on Design, Test, Integration and Packaging of MEMS/MOEMS (DTIP 2002), Cannes, France, May 2002, pp. 660–669.

Ayazi, et al.; A High Aspect–Ration Polysilicon Vibrating Ring Gyroscope; Solid–State Sensor and Actuator Workshop, Hilton Head Island, South Carolina, Jun. 4–8, 2002; pp 289–292.

Ayazi, et al.; High Aspect–Ratio Dry–Release Poly–Silicon MEMS Technology for Inertial–Grade Microgyroscopes; IEEE; 2000; pp 304–308.

Ayazi, et al.; Design and Fabrication of A High–Performance Polysilicon Vibrating Ring Gyroscope; IEEE; 1998; pp 621–626.

Selvakumar, et al.; A High Sensitivity Z–Axis Torsional Silicon Accelerometer; The International Electron Devices Meeting; San Francisco, CA; Dec. 8–11, 1996.

Hao, et al.; An Analytical Model for Support Loss in Micromachined Beam Resonators With In–Plane Flexural Vibrations; Sensors and Actuators, A 109; 2003; pp 156–164.

Pourkamali, et al.; High–Q Single Crystal Silicon HARPSS Capacitive Beam Resonators With Self–Aligned Sub–100–nm Transduction Gaps; Journal of Microelectromechanical Systems, vol. 12, No. 4; Aug. 2003; pp 487–496.

Ayazi; The HARPSS Process for Fabrication of Precision MEMS Inertial Sensors; Mechatronics 12; 2002; pp 1185–1199.

Ayazi; A HARPSS Spolysilicon Vibrating Ring Gyroscope; Journal of Microelectromechanical Systems; vol. 10, No. 2; Jun. 2001; pp 169–179.

Ayazi, et al.; High Aspect–Ratio Combined Poly and Single–Crystal Silicon (HARPSS) MEMS Technology; Journal of Microelectromechanical Systems; vol. 9, No. 3; Sep. 2000; pp 288–294.

Ayazi, et al.; High Aspect–Ratio Polysilicon Micromachining Technology; Sensors and Actuators; 87; 2002; pp 46–51.

Yazdi, et al.; Micromachined Inertial Sensors; Proceedings of the IEEE; vol. 86, No. 8; Aug. 1998; pp 1640–1659.

* cited by examiner

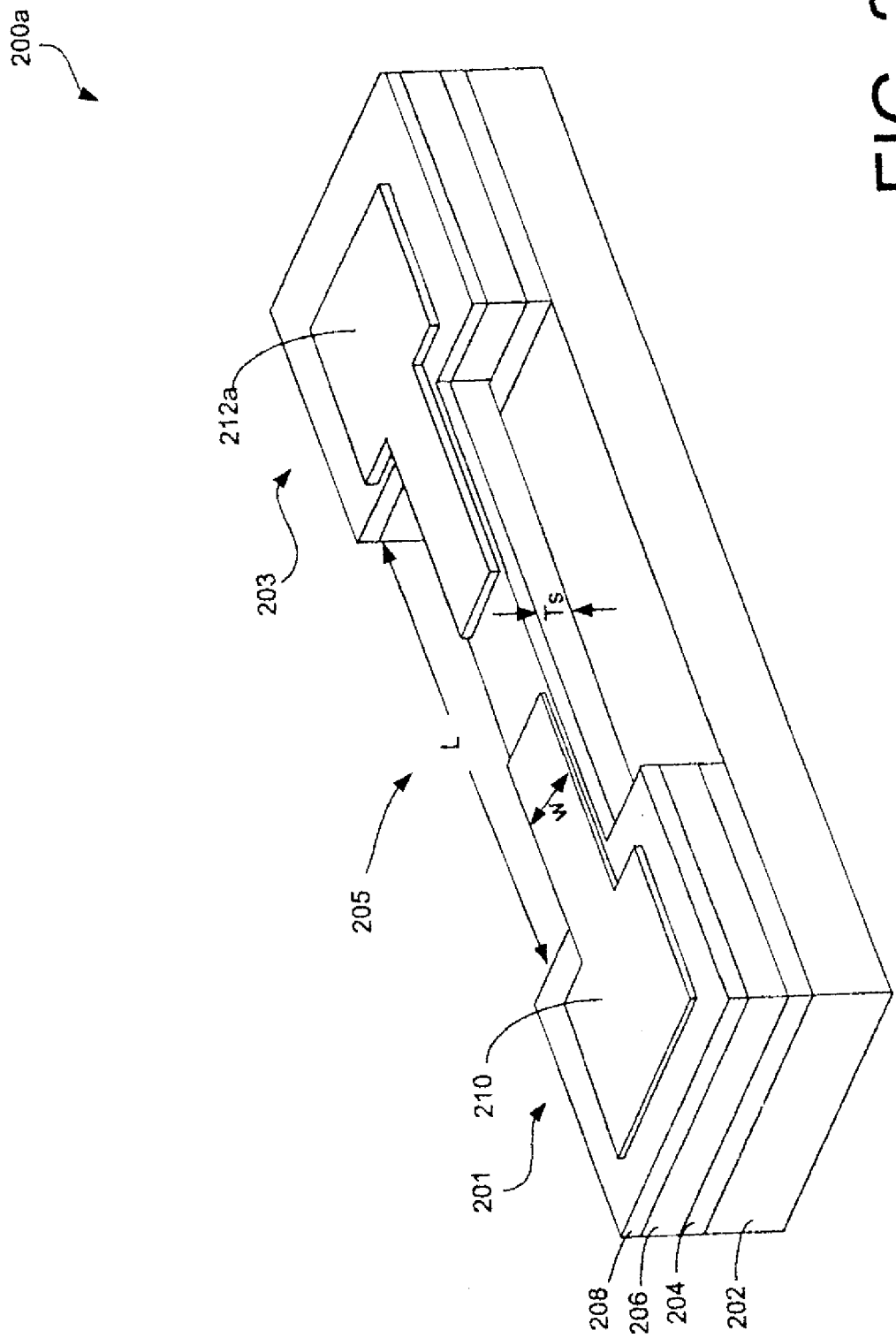

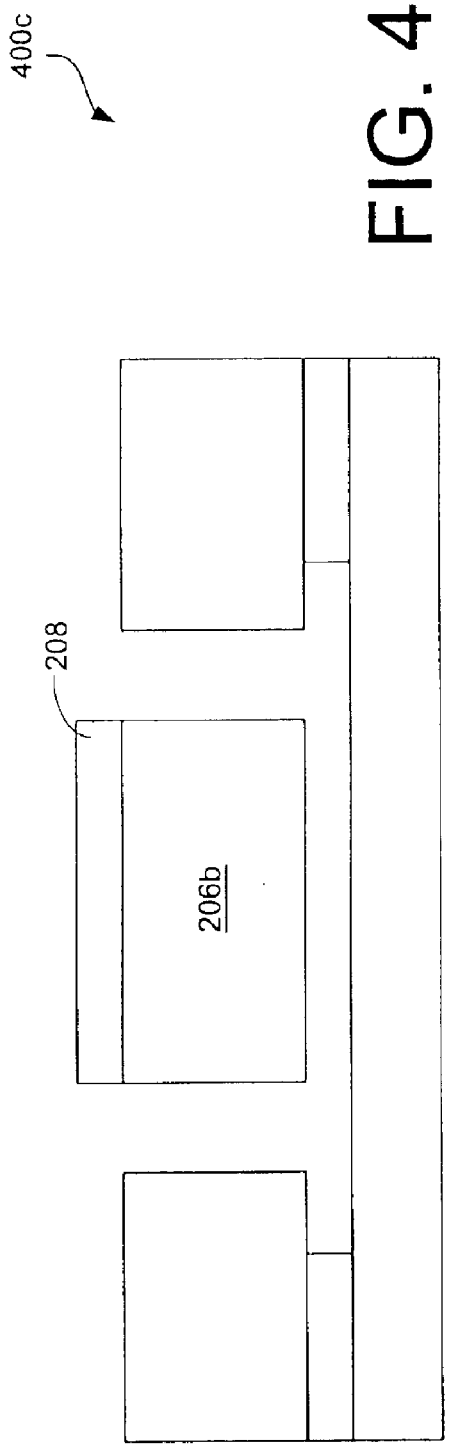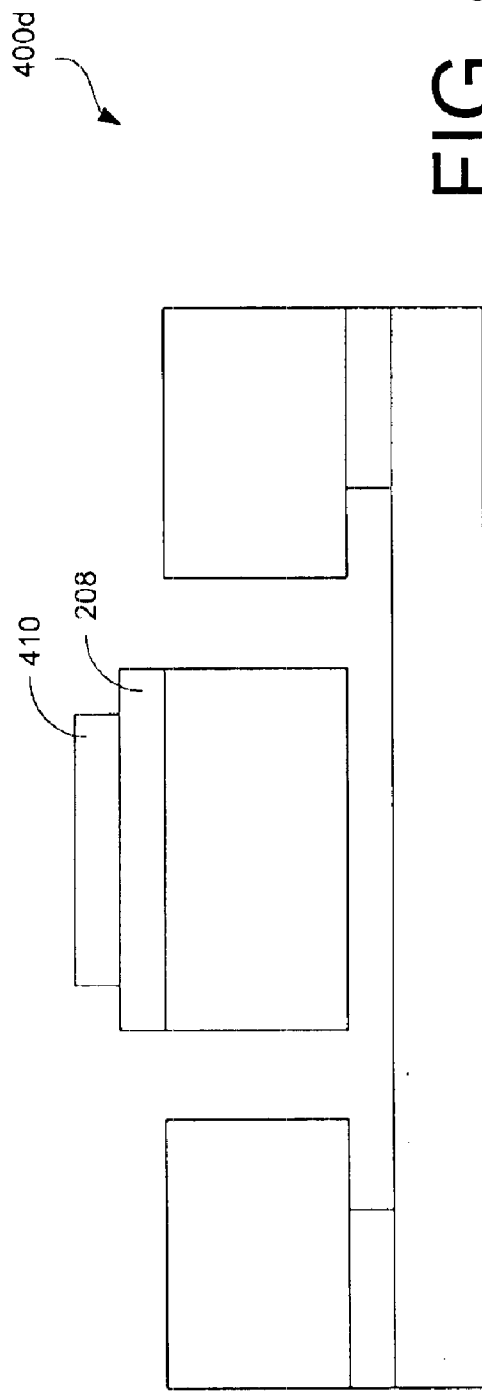

PIEZOELECTRIC ON SEMICONDUCTOR-ON-INSULATOR MICROELECTROMECHANICAL RESONATORS

CROSS-REFERENCE TO RELATED APPLICATION

This application claims the benefit of U.S. Provisional Application No. 60/400,030, filed Aug. 1, 2002, which is entirely incorporated herein by reference.

This application is related to copending U.S. Utility patent application entitled "Capacitive Resonators and Methods of Fabrication," Ser. No. 10/632,176, filed on the same date.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of Contract No. DAAH01-01-1-R004 awarded by the U.S. Army.

TECHNICAL FIELD

The present invention is generally related to MEMS (micro-electro-mechanical systems) technology, and, more particularly, is related to piezoelectric resonators.

BACKGROUND OF THE INVENTION

Advanced consumer electronics such as miniature radios and wristwatch cellular phones pose severe limitations on the size and cost of frequency selective units contained therein. MEMS (micro-electro-mechanical systems) resonators are receiving increased attention as building blocks for integrated filters and frequency references to replace bulky, off-chip ceramic and SAW (surface acoustic wave) devices, among others. Small size, low power consumption and ease of integration with microelectronic circuits constitute the major advantages of MEMS resonators.

Several all-silicon resonators with capacitive transduction mechanisms are known, revealing high mechanical quality factors (Q) and optimal performance in the IF (intermediate frequency) and VHF (very high frequency) range. However to reduce the motional resistance of such capacitive resonators for higher frequency applications, gap spacing on the order of nanometer dimensions are often required, which can complicate the fabrication process for these devices.

Piezoelectric Film Bulk Acoustic Resonators (FBAR), characterized by a lower motional resistance than their capacitive counterparts, have proven to be suitable for UHF (Ultra-high frequency) applications. However, FBAR resonators generally have low quality factors and no electrostatic fine-tuning capabilities. Further, fabrication methods for these devices are limited practically in their ability to create thick and/or uniform mechanical layers due in part to the long processing times associated with fabrication of thick substrates.

Thus, a need exists in the industry to address the aforementioned and/or other deficiencies and/or inadequacies.

SUMMARY OF THE INVENTION

Embodiments of the present invention provide piezoelectric resonators.

Briefly described, one embodiment of the piezoelectric resonator, among others, includes a resonating member having a bi-directionally adjustable resonance frequency, the resonating member including a semiconductor material of a semiconductor-on-insulator wafer, the semiconductor-on-insulator wafer including an oxide layer adjacent to the semiconductor material and a handle layer adjacent to the oxide layer, the oxide layer disposed between the handle layer and the semiconductor material, an electrode, and a piezoelectric material disposed between the semiconductor material and the electrode, and a capacitor created by the semiconductor material and the handle layer separated by an air gap formed out of the oxide layer, wherein the capacitor is configured to receive a direct current voltage that adjusts the resonance frequency of the resonating member.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 2A–2C are schematic diagrams that illustrate several piezoelectric beam resonator embodiments.

FIGS. 4B–4E are schematic diagrams that illustrate the method shown in FIG. 4A.

DETAILED DESCRIPTION OF THE PREFERRED EMBODIMENTS

Figure 1:
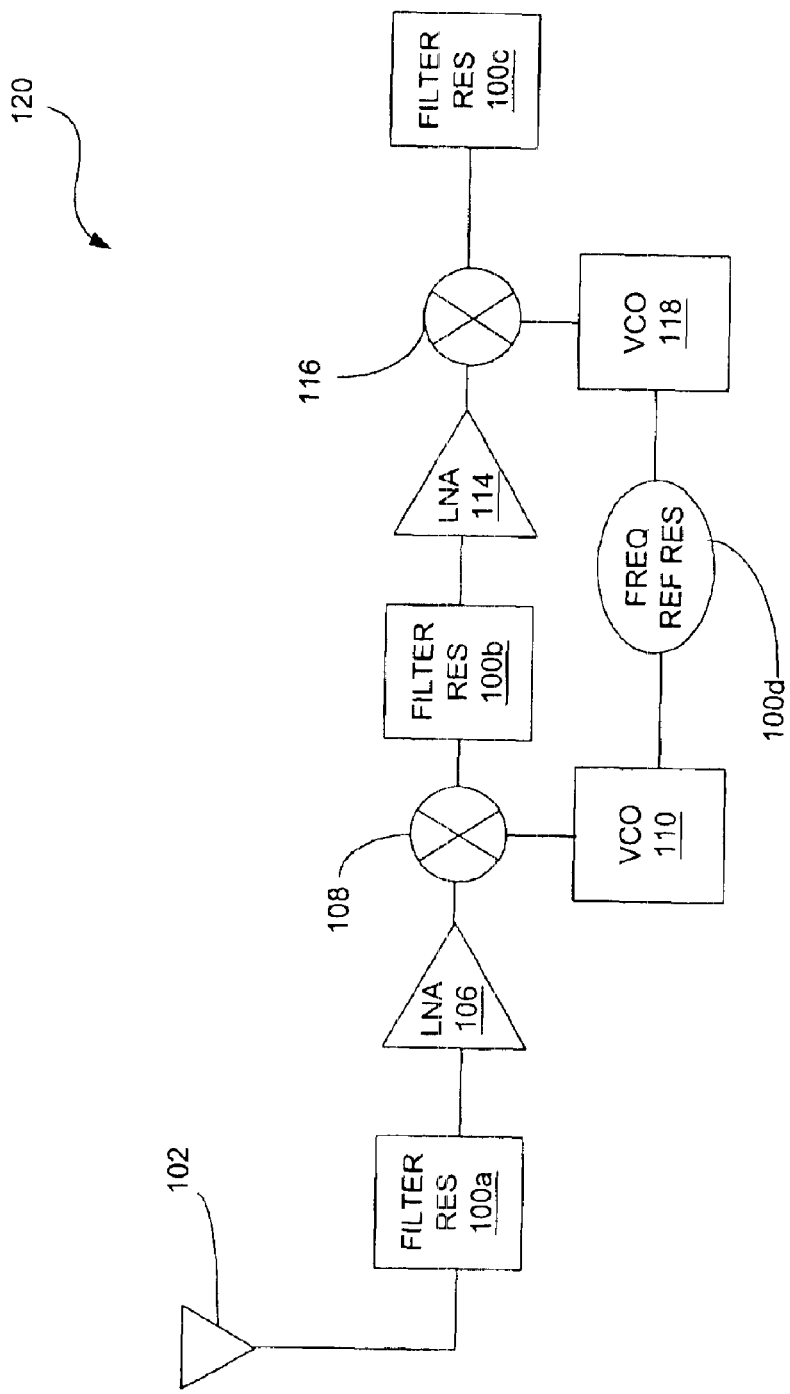
FIG. 1 is a schematic diagram that illustrates one exemplary implementation for the embodiments of the invention.

Embodiments of piezoelectric resonators and methods for fabricating the same are disclosed. In general, the piezoelectric resonator embodiments include voltage tunable, piezoelectrically-transduced, high-mechanical Q (Quality Factor) semiconductor resonators (or resonating element) derived at least in part from semiconductor-on-insulator (SOI) substrates. The embodiments of the invention include substantially all semiconductor materials for the resonating element, such as germanium, silicon, among others. Further, the embodiments of the invention include substantially all semiconductor materials in a variety of crystal alignments or configurations, including single crystal structures, poly structures, amorphous structures, among others. Q can generally be described as a measure of energy stored in a system divided by the energy dissipated in the system. Q can be characterized in terms of frequency response of a resonator, such as the ratio of the center frequency ($f_o$) to the 3-dB (decibel) bandwidth of the resonator device. An active piezoelectric thin-film material, such as zinc-oxide (ZnO), aluminum nitride (AlN), lead zirconate titanate (PZT), etc., is disposed between an electrode (e.g., comprised of a metal such as aluminum) and a low resistivity silicon or other semiconductor material. One mechanism for choosing an appropriate piezoelectric material can be based on selecting a higher product value of the combination of the material's Young's modulus and piezoelectric coefficient. The thin piezoelectric film provides for high electromechanical coupling and/or provides for small equivalent motional resistance (e.g., equivalent resistance of the device in the electrical domain), hence reducing noise problems and enhancing filter designability. In one embodiment, the resonating element can be substantially made out of single crystal silicon (SCS), which has a higher inherent mechanical Q than bulk piezoelectrics. Functions of actuation and sensing are preferably achieved by piezoelectric mechanisms. In other words, the piezoelectric material or thin film functions as the transduction element of the device.

Through the use of the SOI substrate, piezoelectric actuation mechanisms can be combined with electrostatic fine-tuning for the center frequency of a given resonator. For example, by applying a DC voltage to a capacitor located between a handle layer of the SOI substrate and the resonator body (e.g., SCS device layer) it is possible to introduce "electrical stiffness" through the action of the capacitance, hence modifying the equivalent stiffness of the beam. In other words, when an electrical field is applied, it is equivalent to applying a defined force that causes a deflection of the resonating element, which in turn causes a change in the internal stress or stiffness of the resonating element.

The following description will guide the reader through several embodiments of a piezoelectric resonator, a method of fabricating the same, and provide performance characteristics of such devices.

The preferred embodiments of the invention may, however, be embodied in many different forms and should not be construed as limited to the embodiments set forth herein; rather, these embodiments are provided so that this disclosure will be thorough and complete, and will fully convey the scope of the invention to those having ordinary skill in the art. For example, although the embodiments of the invention can be used with substantially any semiconductor substrate and/or piezoelectric material, the preferred embodiments of the invention will be described using an SCS resonating element and a ZnO thin film for the piezoelectric material, with the understanding that other semiconductor materials in different crystal alignments or structures and/or different piezoelectric material are also included within the scope of the invention.

FIG. 1 is a schematic diagram that illustrates one exemplary implementation for the embodiments of the invention. Select receiver components of a communication device 120 are shown, with the understanding that transmitter components can also benefit from the embodiments of the invention. The communication device 120 can include a portable transceiver, such as a cellular phone, among other devices. The communication device 120 includes an antenna 102, piezoelectric resonator devices 100a–100c configured as frequency selective filters, low-noise amplifiers 106 and 114, mixers 108 and 116, voltage-controlled oscillators 110 and 118, and a frequency reference piezoelectric resonator device 100d. All components shown except for resonator devices 100a–100d are known, and thus further explanation is omitted for brevity. The use of piezoelectric resonators 100a–100d can result in a reduction in the number of components in the communication device 120. Piezoelectric resonators 100a–100d are very selective at high frequencies, thus substantially obviating the need for pre-amplifier selection and other frequency transformation and/or amplification devices that operate to provide signal processing at frequencies that current devices most efficiently operate under. The piezoelectric resonator devices of the preferred embodiments possess high quality factors at high frequencies, enabling frequency selection with substantially fewer components.

Figure 2B:
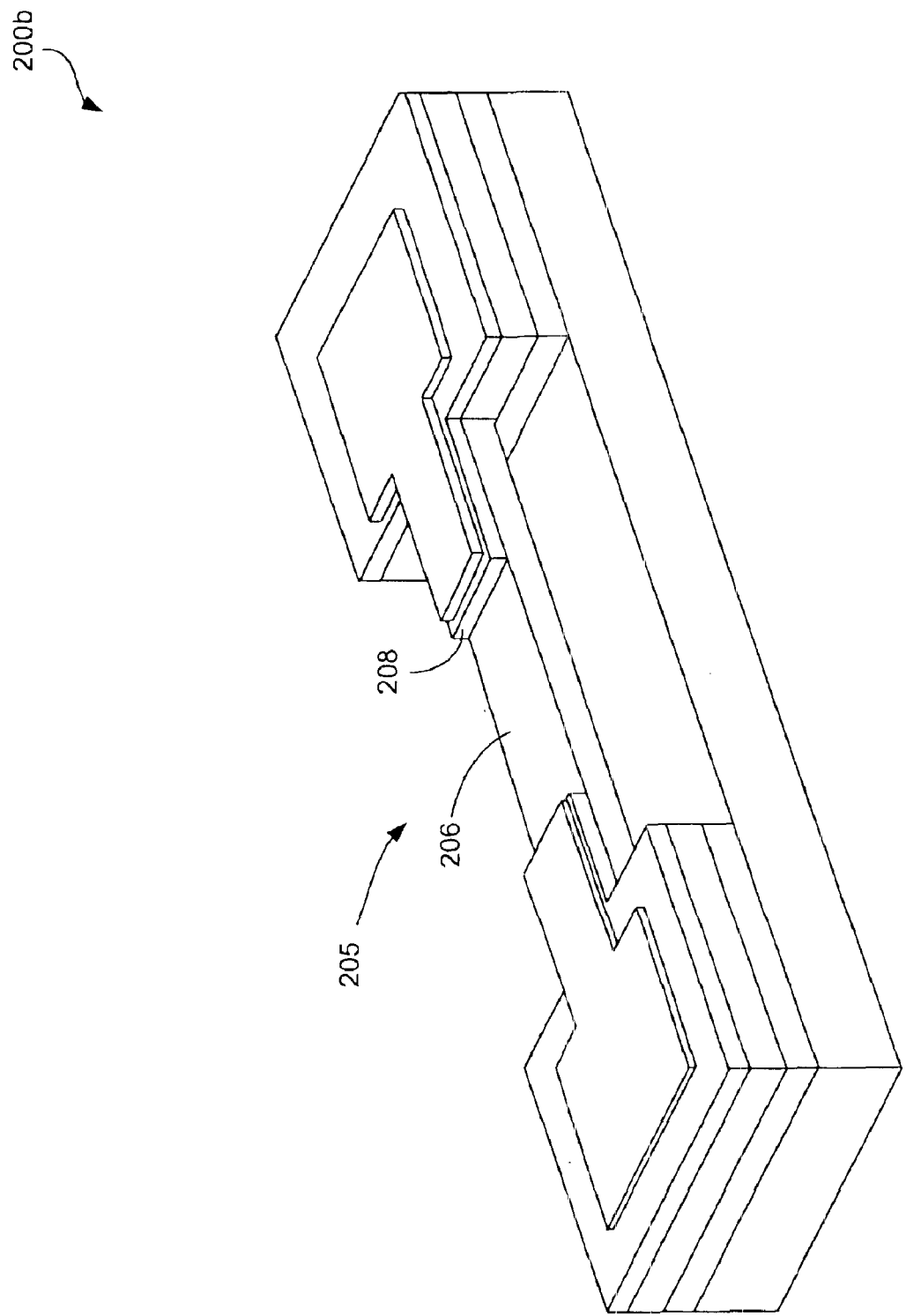
Figure 2C:
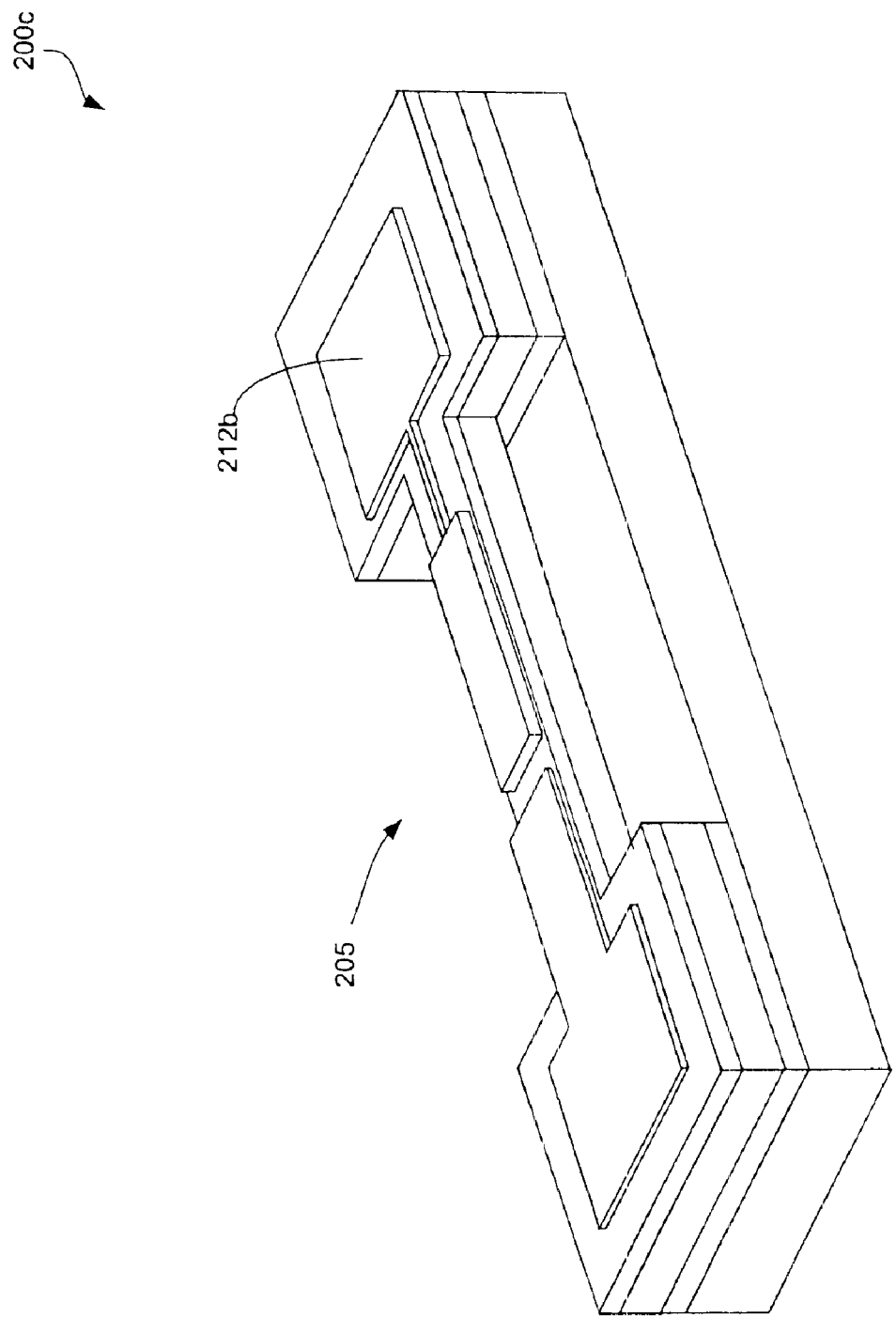

FIGS. 2A–2C are schematic diagrams that illustrate several piezoelectric beam resonator embodiments. FIG. 2A is a schematic diagram of a first embodiment configured as a clamped-clamped resonator beam 200a. The clamped-clamped resonator beam 200a includes a handle layer 202, an oxide layer 204, a device layer 206, a piezoelectric layer 208, a drive electrode 210, and a sense electrode 212 a The "clamped" regions 201 and 203 correspond to the location where the SOI substrate is secured to the underlying handle layer 202, which in turn can be secured to a printed circuit board, among other devices. In some embodiments, the underlying handle layer 202 is the substrate in an integrated circuit, to which the SOI portion is secured. The "beam" region 205, having a length "L," spans between the two clamped regions 201 and 203, and includes the portion of the piezoelectric resonator 200a that is free to vibrate. The device layer 206 and the oxide layer 204 collectively represent the SOI substrate. Some exemplary thicknesses of the device layer 206 (e.g., Ts) can range from approximately 4.0–5.0 microns, although different thickness ranges are possible (e.g., 0.2 microns–30 microns). Some exemplary thicknesses of the oxide layer 204 range from approximately 1.0–5 microns. The handle layer 202 provides mechanical support for the clamped-clamped beam resonator 200a. The piezoelectric layer 208 is disposed in precise locations between the electrodes 210 and 212a and the device layer 206. The piezoelectric layer 208 can have a thickness of 0.2 microns–0.3 microns, as one example range. The device layer 206 can be a low resistivity SCS substrate, with higher quality silicon (e.g., zero or substantially zero defects) situated in the upper region of the device layer 206. The electrodes 210 and 212a can be comprised of aluminum, among other metals, and example thicknesses include a range of 0.1–0.2 microns. The absence of a bottom metal electrode (e.g., a bottom electrode is conventionally used for piezoelectric devices) reduces the number of stacked layers, which could ultimately affect the mechanical Q of the resonator.

In operation, an alternating current (AC) voltage (source not shown) can be applied at the drive electrode 210 according to well-known mechanisms. Responsively, the piezoelectric layer 208 produces a distributed moment, which causes the beam 205 to deflect in the "z" direction (e.g., out-of-plane deflections). The deflection is sensed at the sense electrode 212a as a result of the piezoelectric effect.

Well-known admittance models of a doubly-clamped piezoelectric beam resonator can be used with modification to model the behavior of the clamped-clamped resonator beam 200a. The electromechanical coupling coefficients at the drive electrode 210, $\eta_{in}$, in and at the sense electrode 212a, $\eta_{out}$ of the clamped-clamped resonator beam 200a are expressed by:

$$\eta_{in} = \frac{d_{31}E_pT_s}{2}\int_0^L W_i''(x)\Phi(x)dx \quad \text{(Eq. 1)}$$

$$\eta_{out} = -\frac{d_{31}E_pT_s}{2}\int_0^L W_0(x)\Phi''(x)dx \quad \text{(Eq. 2)}$$

where $d_{31}$ is the transverse piezoelectric coefficient, $E_p$ is the modulus of elasticity of ZnO, and $\Phi(x)$ is the function describing the mode shape of the clamped-clamped resonator beam 200a. Note that slightly different equations for piezoelectric resonator blocks apply, as would be understood by those having ordinary skill in the art. Ts is the height of the device layer 206. The equivalent motional resistance of the resonating element (e.g., the beam 205) depends on the squared inverse of the electromechanical coupling. Therefore the values of $\eta_{in}$ and $\eta_{out}$ are preferably maximized to achieve low values of the motional resistance. The maximum value of the two integrals in Eqs. 1 and 2 occurs for electrode edges placed at inflection points of the beam mode shape. In one embodiment, the inflection points coincide with 22.4% and 77.6% of the beam length. Therefore the final input to output admittance, $Y_{oi}$, of an SCS resonator (i.e., a resonator that includes a device layer comprised of SCS) with piezoelectric transduction becomes:

$$Y_{oi} = \frac{\left(2.49 \cdot d_{31}E_pT_s\frac{W}{L}\right)^2 s}{M_1 s^2 + \frac{M_1 \omega_n}{Q}s + K_1} \quad \text{(Eq. 3)}$$

where $M_1$ and $K_1$ are first mode equivalent mass and stiffness of the micromechanical resonator, $\omega_n$ is the natural resonance frequency of the beam, s is the Laplace variable, and W is the width of the electrodes 210 and 212a. If the thickness of the piezoelectric layer 208 is negligible compared to the height, Ts, of the silicon material of the resonator body, the resonance frequency can be approximately expressed by the equation for a beam with isotropic properties:

$$f_0 = 1.03\frac{T_s}{L^2}\sqrt{\frac{E_s}{\rho_s}} \quad \text{(Eq. 4)}$$

where $E_s$ and $\rho_s$ are respectively the modulus of elasticity and the density of silicon.

FIG. 2B is a schematic diagram of a second embodiment configured as a clamped-clamped resonator beam 200b with the piezoelectric layer 208 etched away. Layers similar to 202–206 and electrodes 210 and 212a of FIG. 2A are the same as shown in FIG. 2B and thus are not discussed here for clarity. The piezoelectric layer 208 is etched in approximately the middle span of the beam 205 to reduce the effective covering of the beam 205 by the piezoelectric layer 208, thus exposing a surface of the device layer 206. Reducing the effective covering of the beam 205 by the piezoelectric layer 208 can enhance the mechanical Q of the piezoelectric beam resonator 200b (e.g., experimentally proven to at least double the mechanical Q when compared to the embodiment illustrated in FIG. 2A).

FIG. 2C is a schematic diagram of a third embodiment configured as a clamped-clamped resonator beam 200c with a sensing electrode 212b that extends further along the beam 205 than the sensing electrode 212a of FIGS. 2A–2B. The extending of the sensing electrode 212b covers the area where the strains have the same sign, thus maximizing the sensed strains and providing for improved sensing capability. The sensing electrode 212b extends over the middle span of the beam 205, with the edges located at the inflection points of the beam mode shape. The sensing electrode 212b may cover approximately twice the area covered by the sensing electrode 212a.

Figure 3:
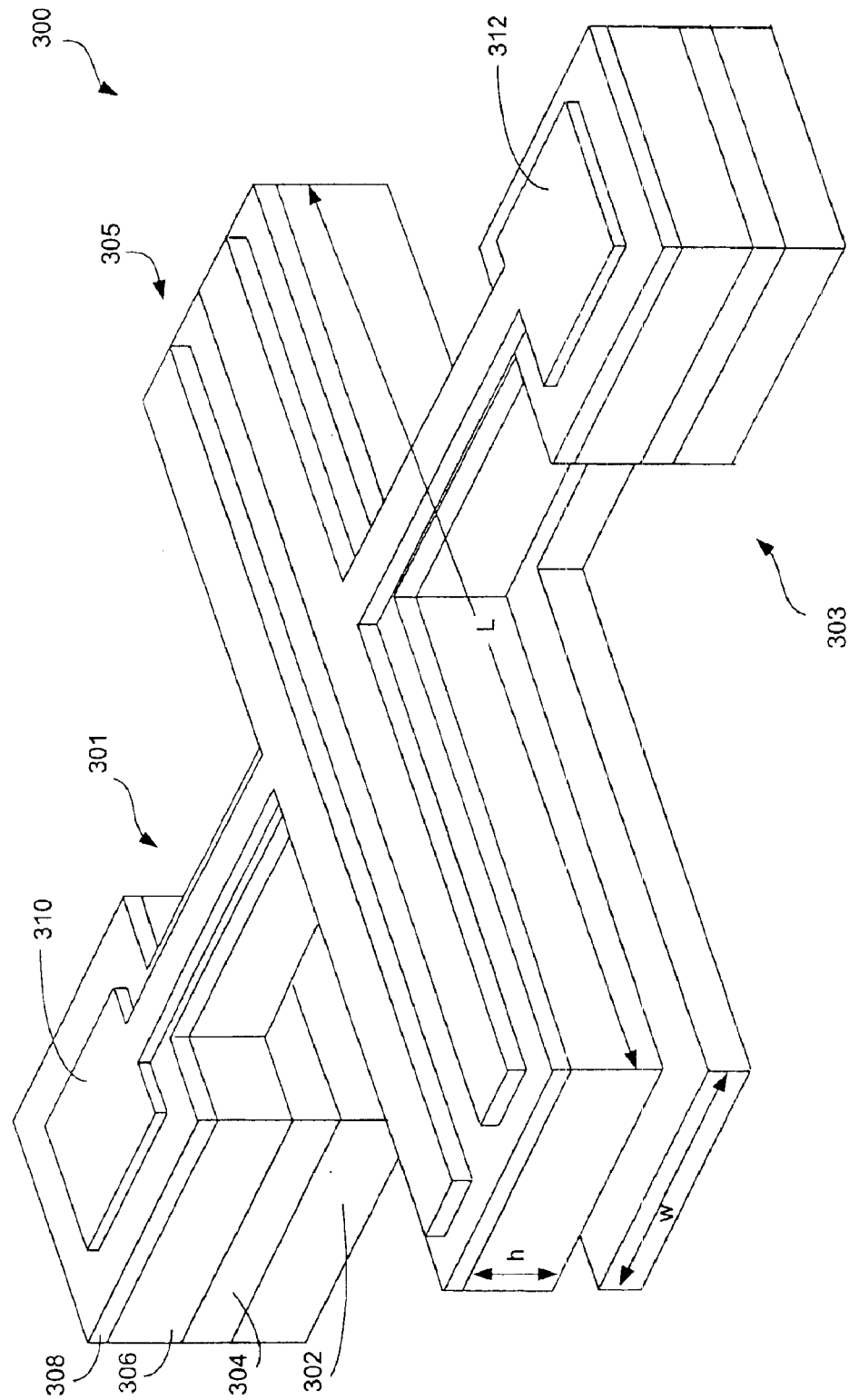
FIG. 3 is a schematic diagram that illustrates a piezoelectric block resonator embodiment.

FIG. 3 is a schematic diagram that illustrates another embodiment in the form of a piezoelectric block resonator 300. The piezoelectric block resonator 300 includes a handle layer 302, an oxide layer 304, a device layer 306, a piezoelectric layer 308, a drive electrode 310, and a sense electrode 312. As shown, the piezoelectric block resonator 300 has a structural configuration that includes a main block 305 centrally supported by self-aligned small tether regions 301 and 303. The resonating element can be comprised of SCS, which has a high inherent mechanical quality factor and stress-free properties. The piezoelectric layer 308 can be comprised of a thin ZnO film that can be sputtered on the top surface of the device layer 306. The ZnO film functions as an insulator between the electrodes 310, 312 and the device layer 306. The piezoelectric layer 308 enables piezoelectric sense and actuation. The drive electrode 310 and the sense electrode 312 can be comprised of aluminum. The drive electrode 310 and sense electrode 312 are configured in a manner to be excited longitudinally (e.g., in-plane displacement), providing for higher frequencies and high order modes. The oxide layer 304 is absent underneath all areas of the piezoelectric block resonator 300 except for the regions substantially under the drive and sense electrode (or pads) 310 and 312 at the end of the tethers 301 and 303. The absence of the oxide layer 304 under these regions enables high frequency, in-plane movement characteristic of the piezoelectric block resonator 300 of the preferred embodiments.

Pure and quasi-length extensional modes can be observed for piezoelectric block resonators 300 of varying lengths. The frequencies of the pure extensional modes for the piezoelectric block resonator 300 are given by equation (5):

$$\omega_n = \frac{(2n-1)\pi}{2l}\sqrt{\frac{E}{\rho_s}} \quad n \text{ is mode number } (n = 1,2,3,\ldots) \quad \text{(Eq. 5)}$$

The use of higher order modes of vibration for the piezoelectric block resonator 300 enables high frequency operation because the natural frequency grows as (2n−1). Further, the use of a block-type structure results in a structure whereby the dimensions of the structure can be kept in a range that can be easily fabricated using optical lithography. Equivalent motional resistance is reduced for this structure, due in part to the high electromechanical coupling factor attributed by piezoelectric transduction. Thus, the signal-to-noise ratio is improved over other transduction devices, such as capacitive devices.

Figure 4A:
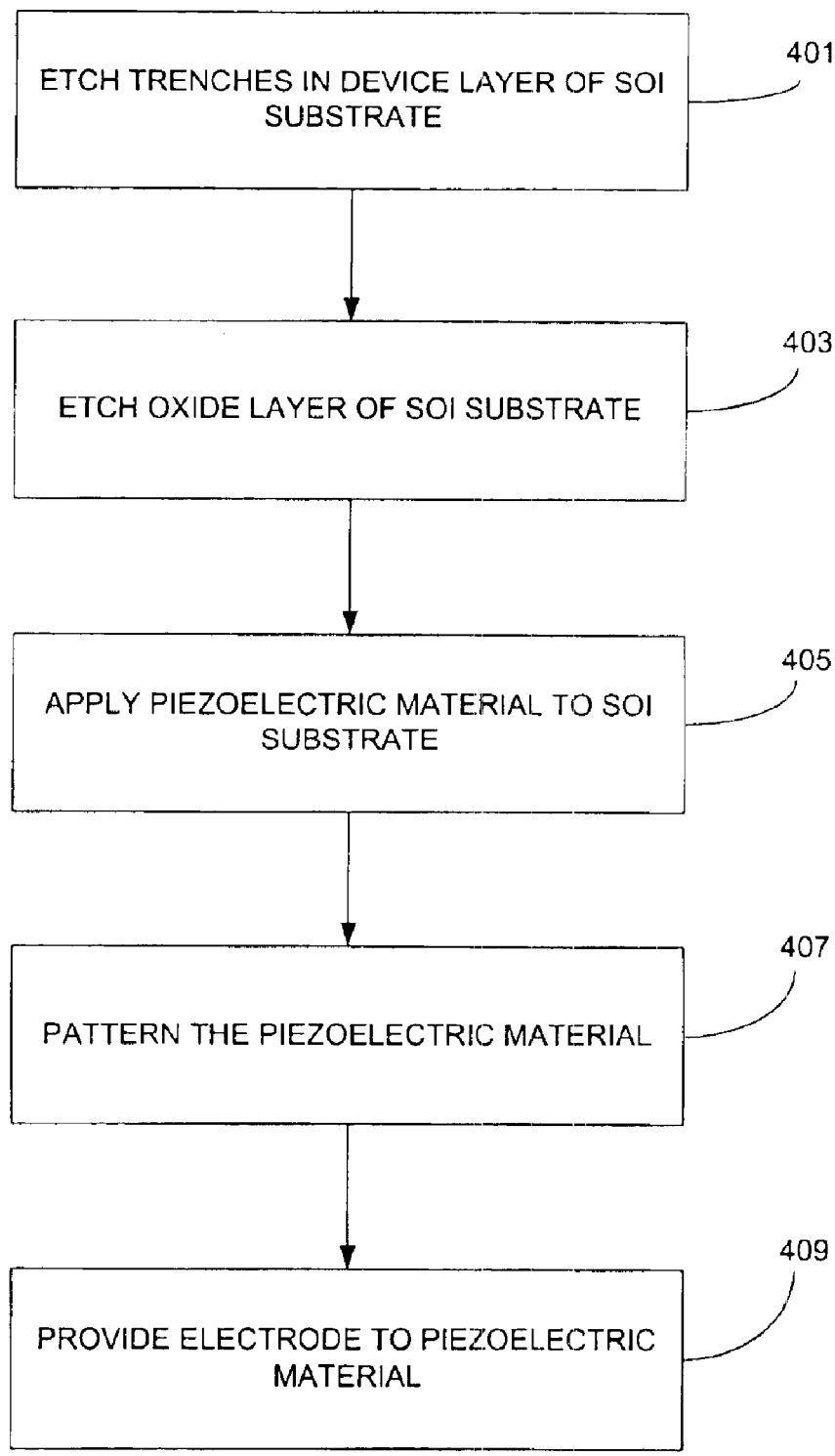
FIG. 4A is a flow diagram that illustrates one method embodiment for fabricating the piezo electric resonator embodiments shown in FIGS. 2A–3.
Figure 4B:
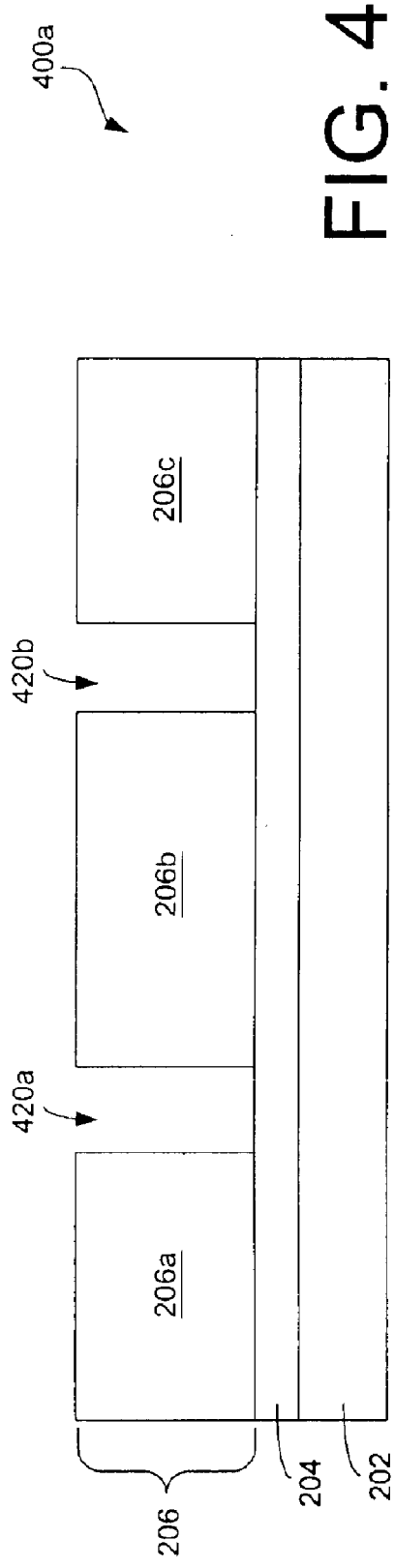

FIG. 4A is a flow diagram that illustrates one method for fabricating the piezoelectric resonator embodiments shown in FIGS. 2A–3. Note that the method is based on one implementation, and that alternate implementations are included within the scope of the preferred embodiments of the invention such that steps can be omitted, added to, and/or executed out of order from that shown or discussed, as would be understood by those reasonably skilled in the art of the present invention. FIGS. 4B–4E are schematic diagrams that are used in cooperation with FIG. 4A to illustrate some of the structural changes that occur during the fabrication method. In general, the fabrication method of the preferred embodiments includes a simple three-mask process that can be used as a fabrication technology for SCS (or other) microelectromechanical resonators used for piezoelectric transduction. Structures similar to or the same as those shown for the clamped-clamped resonator beam 200b of FIG. 2B are used as a non-limiting example, with the understanding that the process applies similarly to the other embodiments shown in FIGS. 2B, 2C and 3. As shown in FIG. 4B, structure 400a comprises a handle layer 202 adjacent to a semiconductor-on-insulator (SOI) substrate. The SOI substrate comprises an oxide layer 204 and a device layer 206. The oxide layer 204, as described above, is disposed between the handle layer 202 and the device layer 206.

The device layer 206 can be comprised of a SCS structure. SCS structures can be made in a wide variety of defined thicknesses. A thicker device layer 206 translates to a wider frequency range. In contrast, conventional systems may use $SiO_2$, which is typically deposited and thus has larger constraints to increasing thickness since the barrier to oxidation increases as the thickness increases.

Referring to FIGS. 4A and 4B, step 401 includes etching trenches 420a, 420b in the device layer 206 of the SOI substrate. This etching step defines the resonator body. In one embodiment, the trenches 420a, 420b are etched to the oxide layer 204, and have a width of approximately 4 micro-meters ($\mu$m). The etching can be performed using reactive ion etching (RIE), such as regular RIE (e.g., for depths of 4–5 microns), or deep reactive ion etching (DRIE) (e.g., for depths greater than 10 microns) using the Bosch process, among other processes. The height of the silicon layer (device layer 206) of the beam 205 (FIG. 2A), for example Ts of FIG. 2A, is defined by the thickness of the device layer 206. As one example, the device layer 206 of the selected SOI can be p-type, with low resistivity, a <100> orientation, and with a nominal thickness of 4±1 $\mu$m. Further, the oxide layer 204 can be 1 $\mu$m thick and the handle layer 202 can be n-type, having a <100> orientation with a nominal thickness of 400 $\mu$m. The choice of an n-type substrate does not necessarily depend on particular design parameters, but primarily on substrate availability.

Figure 4C:
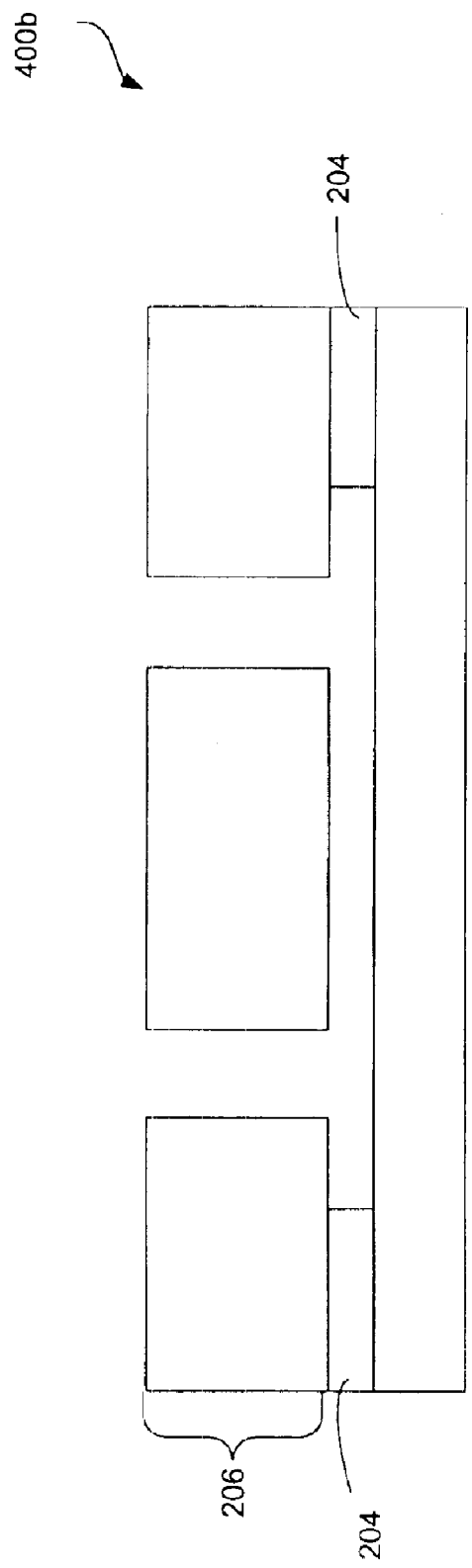

Referring to FIGS. 4A and 4C, step 403 includes etching the oxide layer 204 of the SOI substrate to form structure 400b. In other words, a cavity is opened underneath the device layer 206. For example, the cavity can be created by isotropic etching of the oxide layer 204 in hydro-flouric acid (HF) solution having a molar concentration of approximately 49%, among other solutions and/or molar concentrations. This etching step provides for a small gap (e.g., approximately 1 $\mu$m) that can be used for capacitive fine-tuning of the beam center frequency.

Referring to FIGS. 4A and 4D, step 405 includes applying a piezoelectric material to the SOI substrate to form structure 400c. For example, a piezoelectric material, such as ZnO, can be sputter-deposited on the SOI substrate to form a piezoelectric layer 208. Other options for applying include high-temperature growth of the ZnO, among others. ZnO is an acceptable choice for the piezoelectric material because of its well-known process of fabrication and ease of integration with current microelectronics. In fact, no high temperature processes are involved in all the fabrication steps described herein. Thus, integration with actual CMOS (complementary-metal-oxide-silicon) technology could be simply implemented as a post-CMOS process. Exemplary deposition parameters can include a temperature of 250° C. for the SOI substrate, a pressure of 6 mTorr, an Ar to $O_2$ mix ratio of 0.5, and a power level of 300 W.

Referring again to FIGS. 4A and 4D, step 407 includes patterning of the piezoelectric material. For example, ZnO can be patterned by wet etching using ammonium chloride ($NH_4Cl$), 5% at 55° C. $NH_4Cl$ is a good choice in that it has a very slow etch rate (50 Å/s) and enables the definition of small features, avoiding severe lateral undercutting. Note that for embodiments where the piezoelectric material is not etched (e.g., the piezoelectric resonator embodiments shown in FIGS. 2A and 2C), step 407 can be omitted. Further, in some embodiments, an additional step can include providing an adhesion layer (e.g., a metal) to improve the adhesion of the piezoelectric material.

Referring to FIGS. 4A and 4E, step 409 includes providing an electrode 410 (e.g., such as electrodes 210 and/or 212a,b of FIG. 2) to the piezoelectric material (i.e., piezoelectric layer 208). In one embodiment, the electrode 410 is defined by a third mask using lift-off (e.g., lifting off portions not needed using a sacrificial layer). For example, 1,000 Å of aluminum can be deposited by electron-beam evaporation. Keeping the thickness of the ZnO and Al layers as low as possible can provide for maximum mechanical Q, in addition to avoiding or mitigating any detrimental effects due to stacked layers of different materials.

Piezoelectric resonators fabricated using the above-described method were tested in a custom-built vacuum chamber capable of pressures as low as 10 $\mu$Torr.

A low-noise JFET (junction field-effect transistor) source-follower with a gain stage was used to interface with the piezoelectric resonators of the preferred embodiments. The sensing interface was built on a printed circuit board (PCB) using surface mount components. The piezoelectric resonator was mounted on the board and wire-bonded. The frequency spectra of the resonators were attained by using a network analyzer.

Table 1 below lists the frequency responses taken from the network analyzer for a 100 $\mu$m long, 20 $\mu$m wide clamped-clamped beam and a 200 $\mu$m long, 20 $\mu$m wide clamped-clamped beam fabricated using the above method and illustrated by the embodiment shown in FIG. 2B. The peak frequency values for $1^{st}$, $3^{rd}$, $5^{th}$, and/or $6^{th}$ resonance modes were determined, the peak values representing the mechanical resonance of the piezoelectric resonator. One purpose for evaluating for higher resonance modes (e.g., harmonics) is to evaluate the quality factor at these higher frequencies.

TABLE 1

| Dimensions | | | | | | Q |
|---|---|---|---|---|---|---|
| (beam-style) | | | | | | |
| length ($\mu$m) | width ($\mu$m) | $F_0$-$1^{st}$ | $F_0$-3rd | $F_0$-5th | $F_0$-6th | (Quality Factor) |
| 100 | 20 | 1.72 MHz | | | | 6200 |
| 200 | 20 | .721MHz | | | | 5400 |
| 200 | 20 | | 3.29 MHz | | | 5300 |
| 200 | 20 | | | 4.87 MHz | | 3000 |
| 200 | 20 | | | | 6.70 MHz | 2400 |

As shown in the first row entry of Table 1, the resonator having a length of 100 $\mu$m and a width of 20 $\mu$m has a center frequency of 1.72 MHz and shows a quality factor of 6,200 at a pressure of approximately 50 mTorr. Piezoelectric resonators with different configurations (e.g., the embodiment shown in FIG. 2A) were tested and showed Qs about two times smaller, in the order of 3,000. Such high values of the quality factor confirm that the choice of SCV as the resonating material is an optimal choice. Further, actuation voltages as low as 700 $\mu$V (e.g., the minimum value enabled by the network analyzer) can excite the piezoelectric resonators, which can show a dynamic range of approximately 45 dB or better.

The piezoelectric resonators of the preferred embodiments can be operated in higher order modes, hence enabling higher frequencies. The placement of the electrodes can be optimized for operation in the fundamental mode. Some high order modes have inflection points within the electrode region, which decimates the charge build-up from the piezoelectric material. Therefore, some of the high order modes cannot be sensed. With the increased degrees of freedom, there are additional high order modes. The frequency responses of a 200 µm long beam in its $1^{st}$–$6^{th}$ mode are also shown in Table 1. A Q of 5,400 at 0.721 MHz was shown at the first resonance mode. A Q of 5,300 at 3.29 MHz was measured for the third resonance mode, with no substantial decrease from the first mode quality factor. The Qs for the fifth and sixth modes, respectively at 4.87 MHz and 6.7 MHz, are approximately halved: a Q of 3,000 was recorded for the fifth mode and a Q of 2,400 for the sixth mode. Thus, as shown in Table 1, by exciting the harmonics, high quality factors (e.g., over 1000) were achieved.

Table 2 below lists the first and second order frequency responses taken from the network analyzer for piezoelectric block resonators, similar to or the same as the embodiment shown in FIG. 3. In particular, piezoelectric block resonators having a thickness of 4–5 µm and dimensions of (a) 480 µm length×120 µm width, (b) 120 µm length×40 µm width, and (c) 240 µm length×20 µm width were tested in an approximately 50 mTorr vacuum, similar to the test arrangement described in association with Table 1. Note that for piezoelectric block resonators of the preferred embodiments, frequency response is not a function of block thickness. Such a feature substantially alleviates the need for uniform substrate thickness.

TABLE 2

(block-style)

| Dimensions | | | |
|---|---|---|---|
| length (µm) | width (µm) | $F_0$-$1^{st}$ and $2^{nd}$ | Q (Quality Factor) |
| 480 | 120 | 66.6 MHz | 5500 |
| 480 | 120 | 195 MHz | 4700 |
| 120 | 40 | 35 MHz | 4500 |
| 120 | 40 | 104 MHz | 4500 |
| 240 | 20 | 16.9 MHz | 11,600 |

As shown, the 480 µm×120 µm piezoelectric block resonators demonstrated high-Q resonant peaks at 66.6 MHz (with Q of 5,500) and 195 MHz (with Q of 4,700) in a 50 mTorr vacuum. These peaks correspond to two quasi-length-extensional mode shapes of the 480×120 µm block. It should be noted that these quasi-extensional modes cannot be calculated using equation (5) above as they show substantial thickness modulation. When testing operation in air, the Q of the 67 MHz peak was reduced only by a factor of 1.25 compared to its Q in vacuum. Higher order modes were also observed in testing.

For the 120 µm×40 µm block resonator, the first and second extensional modes were measured at 35 MHz and 104 MHz (with Q of 4,500), which is in good agreement with theoretical values calculated using equation (5). The highest Q measured for the block resonators was 11,600, which has been measured for the first extensional mode of a 240 µm×20 µm block at 17 MHz. ANSYS simulations were also performed that verified the observed resonant peaks for the data shown in Table 1 and Table 2.

Figure 5:
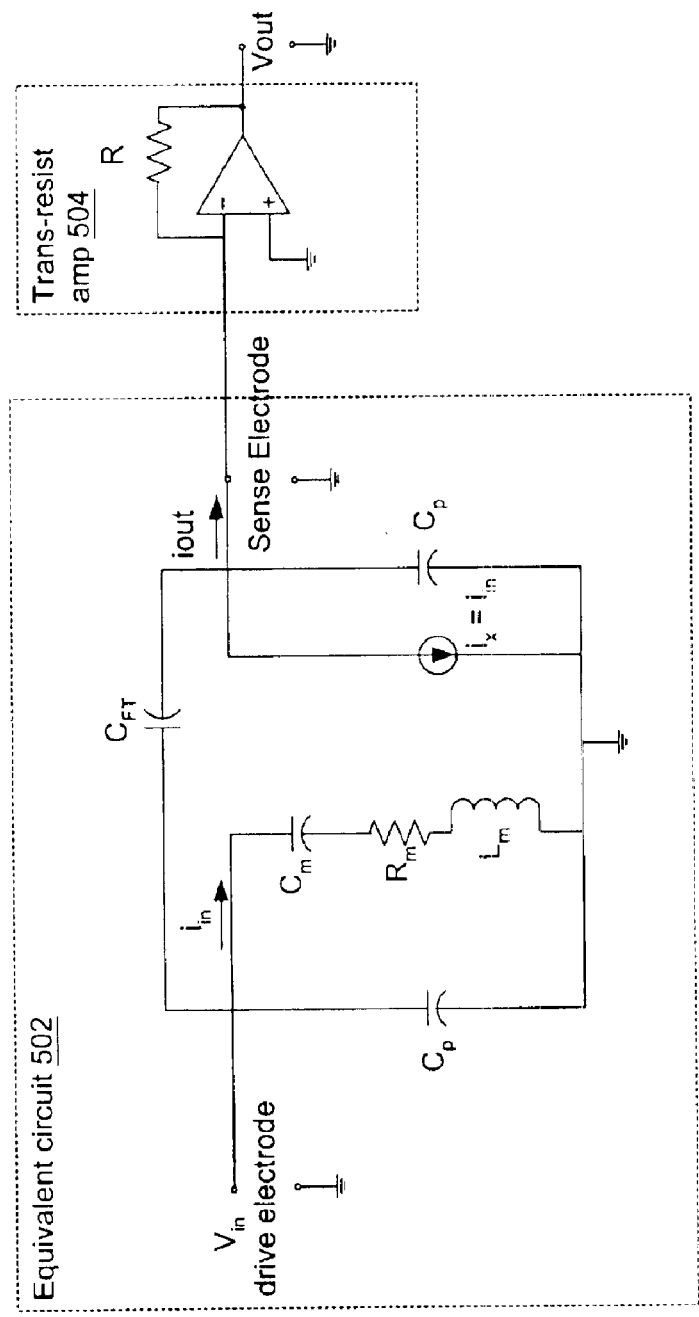
FIG. 5 is a schematic diagram that illustrates an equivalent electrical circuit for the piezoelectric resonator embodiments of FIGS. 2A–3.

FIG. 5 shows a circuit arrangement 500 including an equivalent circuit 502 for modeling the resonance behavior of a piezoelectric beam and block resonators of the preferred embodiments and a trans-resistance amplifier circuit 504 that can be used in conjunction with the equivalent circuit 502. As shown, the equivalent circuit 502 includes an input voltage ($V_{in}$) which corresponds to the potential at a drive electrode. Vin can be, for example, 1 millivolts (mV) to 100 mV. The equivalent circuit 502 includes parasitic capacitance ($C_p$) associated with the capacitance between the bonding pads and ground. The feed-through capacitance, $C_{FT}$ corresponds to the capacitance between the input and output port (e.g., the distance between the electrodes located on the beam 205 of FIG. 2A). The body of the resonator (e.g., resonating element) can be modeled with the series capacitor ($C_m$), resistor ($R_m$), and inductor ($L_m$). For example, the frequency response of the mechanical resonator is determined by:

$$f=1/[(2\pi(LC)^{1/2}] \quad \text{(Eq. 6)}$$

The assumption made for the equivalent circuit 502 is that the sense electrode is at virtual ground, enabling modeling as a unilateral device. The output current ($i_{out}$) is provided to a high impedance device, such as the operational amplifier of the trans-resistance amplifier circuit 504, where a voltage drop is created across the resistor, R, of the trans-resistance amplifier 504. The value of the voltage is implementation-dependent. The larger the value of R of the trans-resistance amplifier 504 and/or the smaller the output current, the larger the output voltage ($V_{out}$).

Electro-static fine-tuning is enabled by the structure of the piezoelectric resonators of the preferred embodiments. In general, tuning is performed by the application of a DC voltage across a capacitor located between the device layer and the handle layer of a piezoelectric resonator, such as the "beam" style piezoelectric resonator. The application of the DC voltage creates a negative mechanical stiffness, which tends to decrease the resonance frequency with the application of increasing DC voltage, thus providing a tuning effect. Another mechanism to provide tuning is to etch out another electrode adjacent to the main "beam" portion of a block-type resonator. The in-plane movement with respect to the adjacent electrode creates a variation in capacitance. Thus, the piezoelectric block resonators provide for voltage-tunable functionality.

Figure 6:
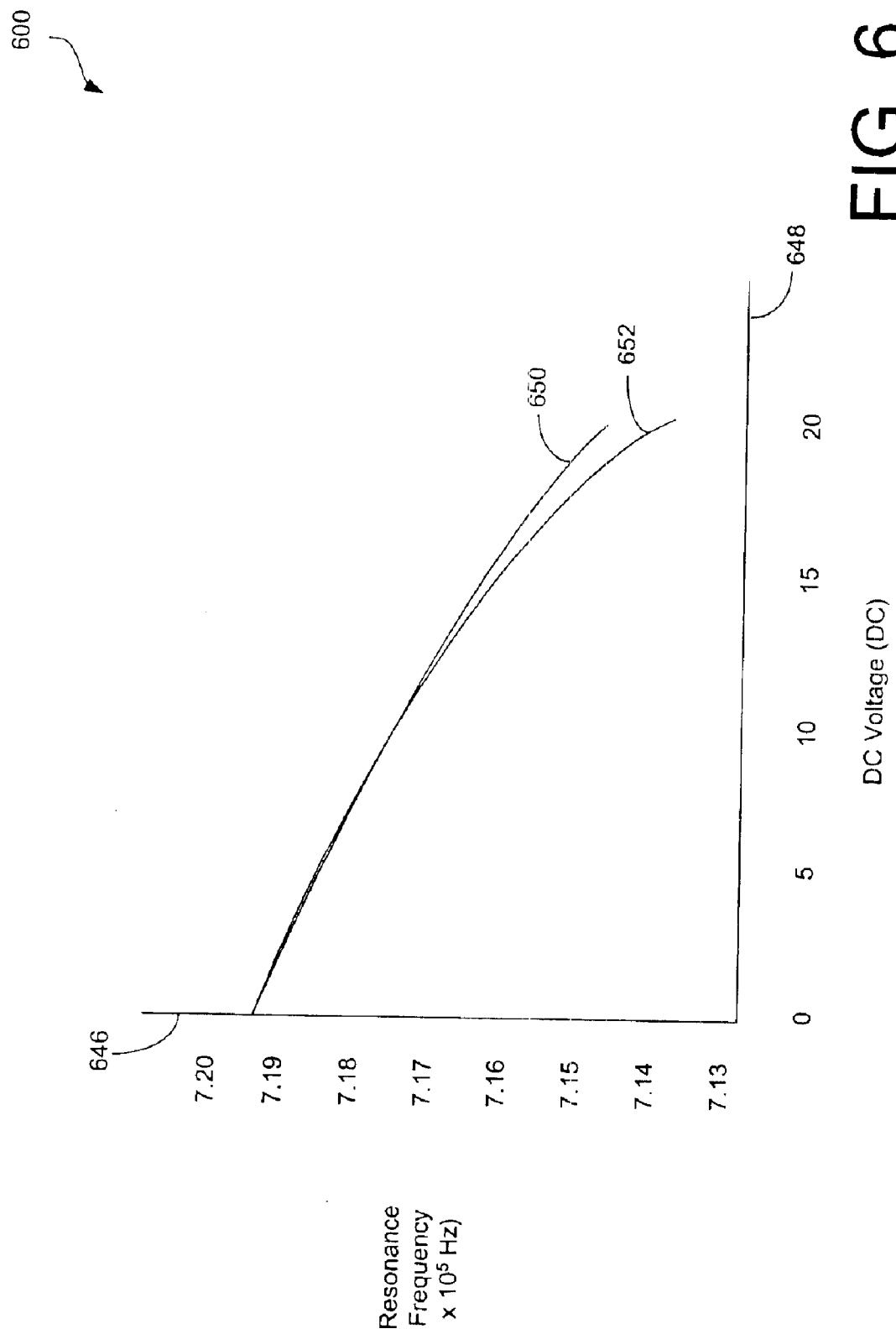
FIG. 6 is a graph that illustrates resonance frequency as a function of direct current (DC) voltage for the piezoelectric resonator embodiments of FIGS. 2A–3.

FIG. 6 shows a graph 600 that provides a comparison between the measured (curve 652) and the theoretical (curve 650) frequency-tuning characteristic for a 200 µm long beam-style, 719 kHz resonator. The data for this graph 600 is determined by changing the DC voltage applied to a capacitor between the handle layer of the SOI wafer or substrate and the device layer of a piezoelectric resonator from 0 to 20 V. Axis 646 provides an indication of resonance frequency, and axis 648 provides an indication of DC voltage. Shown is an electrostatic tuning range of 6 kHz. The tunable frequency characteristics are uniquely related to the fabrication methodology described in association with FIG. 4. This fabrication methodology enables the combination of piezoelectric transduction mechanisms with electrostatic tuning, the latter of which was generally considered a sole prerogative of capacitive resonators. Uncertainty on the exact extension of the etched area underneath the beam (e.g., of the device layer 206, FIG. 2A, for example) could account for the small mismatch between the theoretical and experimental curves 650 and 652, respectively.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A piezoelectric resonator, including:
   a resonating member having a bi-directionally adjustable resonance frequency, said resonating member including:
   a semiconductor material of a semiconductor-on-insulator wafer, the semiconductor-on-insulator wafer including an oxide layer adjacent to the semiconductor material and a handle layer adjacent to the oxide layer, the oxide layer disposed between the handle layer and the semiconductor material;
   an electrode;
   a piezoelectric material disposed between the semiconductor material and the electrode; and
   a capacitor created by the semiconductor material and the handle layer separated by an air gap formed out of the oxide layer, wherein the capacitor is configured to receive a direct current voltage that adjusts the resonance frequency of the resonating member.

2. The piezoelectric resonator of claim 1, further including, in response to an excitation force applied to the resonating member, a quality factor for a beam configuration that ranges between approximately 2400–6200 for resonance frequencies ranging between approximately 1.72 megahertz–6.7 mega-hertz.

3. The piezoelectric resonator of claim 1, further including, in response to an excitation force applied to the resonating member, a quality factor for a beam configuration that ranges between approximately 3000–6200 for resonance frequencies ranging between approximately 1.72 megahertz–4.87 mega-hertz.

4. The piezoelectric resonator of claim 1, further including, in response to an excitation force applied to the resonating member, a quality factor for a beam configuration that ranges between approximately 5300–6200 for resonance frequencies ranging between approximately 1.72 megahertz–3.29 mega-hertz.

5. The piezoelectric resonator of claim 1, further including, in response to an excitation force applied to the resonating member, a quality factor for a beam configuration that ranges between approximately 5400–6200 for resonance frequencies ranging between approximately 0.721 megahertz–1.72 mega-hertz.

6. The piezoelectric resonator of claim 1, further including, in response to an excitation force applied to the resonating member, a quality factor for a block configuration that ranges between approximately 5500–11,600 for resonance frequencies ranging between approximately 16.9 megahertz–195 mega-hertz.

7. The piezoelectric resonator of claim 1, further including, in response to an excitation force applied to the resonating member, a quality factor for a block configuration that ranges between approximately 4700–11,600 for resonance frequencies ranging between approximately 16.9 megahertz–195 mega-hertz.

8. The piezoelectric resonator of claim 1, further including, in response to an excitation force applied to the resonating member, a quality factor for a block configuration that ranges between approximately 4500–11,600 for resonance frequencies ranging between approximately 16.9 megahertz–195 mega-hertz.

9. The piezoelectric resonator of claim 1, wherein the semiconductor material, the electrode, and the piezoelectric material are configured in one of a beam configuration and a block configuration.

10. The piezoelectric resonator of claim 1, wherein the electrode includes one of a sense electrode and a drive electrode.

11. The piezoelectric resonator of claim 10, wherein the sense electrode and the drive electrode are separated by the piezoelectric material.

12. The piezoelectric resonator of claim 10, wherein the sense electrode and the drive electrode are separated by the surface of the semiconductor material.

13. The piezoelectric resonator of claim 1, wherein the thickness of the semiconductor material ranges between approximately 0.2–30 microns.

14. The piezoelectric resonator of claim 1, wherein the piezoelectric material includes one of zinc oxide, aluminum nitride, and lead zirconate titanate.

15. The piezoelectric resonator of claim 1, wherein the semiconductor material includes one of silicon, germanium, single crystal semiconductor material, polycrystalline semiconductor material, and amorphous semiconductor material.

16. The piezoelectric resonator of claim 1, further including an adhesion layer disposed between the piezoelectric material and the semiconductor material.

17. The piezoelectric resonator of claim 1, wherein the resonating member includes a resonance frequency resulting from at least one of in-plane and out-of-plane movement of the resonating member.

18. A communications device, including:
    a receiver; and
    a piezoelectric resonator disposed in the receiver, the piezoelectric resonator including:
    a resonating member having a bi-directionally adjustable resonance frequency, said resonating member including:
    a semiconductor material of a semiconductor-on-insulator wafer, the semiconductor-on-insulator wafer including an oxide layer adjacent to the semiconductor material and a handle layer adjacent to the oxide layer, the oxide layer disposed between the handle layer and the semiconductor material;
    an electrode;
    a piezoelectric material disposed between the semiconductor material and the electrode; and
    a capacitor created by the semiconductor material and the handle layer separated by an air gap formed out of the oxide layer, wherein the capacitor is configured to receive a direct current voltage that adjusts the resonance frequency of the resonating member.

19. The communications device of claim 18, wherein the piezoelectric resonator is configured as at least one of a filter and a frequency reference device.

20. The communications device of claim 18, further including a transmitter.

21. The communications device of claim 20, wherein the transmitter includes a second piezoelectric resonator, wherein the second piezoelectric resonator is configured as at least one of a filter and a frequency reference device.

22. The piezoelectric resonator of claim 1, further including a capacitor created by a second electrode disposed adjacent to the piezoelectric resonator and separated by a gap, wherein the capacitor is configured to receive a direct current voltage to adjust the resonance frequency of the resonating member.

23. The piezoelectric resonator of claim 1, wherein the oxide layer is a thin film layer of a thickness ranging between and including 0.1–5 microns.

* * * * *